US006661372B1

(12) United States Patent
Girerd et al.

(10) Patent No.: US 6,661,372 B1
(45) Date of Patent: Dec. 9, 2003

(54) CLIENT-SERVER BASED REMOTE LOCATOR DEVICE

(75) Inventors: Richard J. Girerd, Palo Alto, CA (US); Norman F. Krasner, San Carlos, CA (US)

(73) Assignee: Qualcomm Incorporated, San Diego, CA (US)

( * ) Notice: Subject to any disclaimer, the term of this patent is extended or adjusted under 35 U.S.C. 154(b) by 313 days.

(21) Appl. No.: 09/684,346

(22) Filed: Oct. 6, 2000

Related U.S. Application Data

(62) Division of application No. 08/708,176, filed on Sep. 6, 1996, now Pat. No. 6,131,067.
(60) Provisional application No. 60/005,318, filed on Oct. 9, 1995.

(51) Int. Cl.[7] .................. H04B 7/185; G01C 21/26; G01B 7/185
(52) U.S. Cl. ............. 342/357.12; 342/357; 342/357.07; 342/357.08; 701/213; 701/214; 701/215
(58) Field of Search .................... 342/357.06, 357.07, 342/357.08, 357.12; 701/213, 214, 215; 709/200

(56) References Cited

U.S. PATENT DOCUMENTS

| | | | |
|---|---|---|---|
| 4,445,118 A | 4/1984 | Taylor et al. ............... | 343/357 |
| 4,601,005 A | 7/1986 | Kilvington ................... | 364/602 |
| 4,701,934 A | 10/1987 | Jasper ........................... | 375/1 |
| 4,785,463 A | 11/1988 | Jane et al. ...................... | 375/1 |
| 4,797,677 A | 1/1989 | MacDoran et al. ........... | 342/352 |
| 4,959,656 A | 9/1990 | Kumar ........................... | 342/418 |
| 4,998,111 A | 3/1991 | Ma et al. ...................... | 342/352 |
| 5,043,736 A | * 8/1991 | Darnell et al. ............ | 342/357.1 |
| 5,119,102 A | 6/1992 | Barnard ........................ | 342/357 |
| 5,202,829 A | 4/1993 | Geier ........................... | 364/449 |

(List continued on next page.)

FOREIGN PATENT DOCUMENTS

| | | | |
|---|---|---|---|
| CA | 1277400 | * | 12/1990 |
| EP | 242099 A2 | | 10/1987 |
| EP | 379198 A2 | | 7/1990 |
| EP | 512789 A2 | | 11/1992 |
| EP | 601293 A2 | | 6/1994 |
| WO | WO 9428434 | | 12/1994 |

OTHER PUBLICATIONS

Benjamin Peterson et al., GPS Receiver Structures for the Urban Canyon, ION–GPS–95, Palm Springs, CA, Sep. 1995.*
"Navigation Journal of the Institute of Navigation, vol. 25, No. 2" The Institute of Navigation, 1978 (entire edition).
"GPS Receiver Structures", Petterson et al., ION–GPS–95, Session C4, Land Vehicular Applications, Palm Springs, CA Sep. 1995.

(List continued on next page.)

*Primary Examiner*—Krisna Lim
(74) *Attorney, Agent, or Firm*—Bruce Greenhalls; Charles Beacon; Philip Wadsworth

(57) ABSTRACT

A user accesses a server using a client. The client provides an identification code which serves to uniquely identify a remote sensor. The remote sensor is capable of providing information related to its position. The server interrogates the remote sensor and, in response, the remote sensor transmits positioning data to the server where it is analyzed to derive the location of the remote sensor. The location so determined is transmitted from the server to the client and is displayed at the client so that the user can identify the location of the remote sensor. The client and the server may be connected to a computer network and the client may use a web browser to interrogate the server. The remote sensor may be a SNAPSHOT GPS receiver or other GPS receiver or positioning device. The user display may be a simple position report, e.g., latitude and longitude, or a graphical report which provides an indication of the remote sensor's location superimposed on a map or other reference.

31 Claims, 10 Drawing Sheets

U.S. PATENT DOCUMENTS

| | | | | |
|---|---|---|---|---|
| 5,223,844 | A | * | 6/1993 | Mansell et al. ............. 342/357 |
| 5,225,842 | A | * | 7/1993 | Brown et al. ................ 342/357 |
| 5,271,034 | A | | 12/1993 | Abaunza ........................ 375/1 |
| 5,311,194 | A | * | 5/1994 | Brown ................... 342/357.06 |
| 5,317,323 | A | | 5/1994 | Kennedy et al. ............ 342/457 |
| 5,323,163 | A | | 6/1994 | Maki .......................... 342/357 |
| 5,365,450 | A | | 11/1994 | Schuchman et al. ........ 364/449 |
| 5,379,047 | A | | 1/1995 | Yokev et al. ................ 342/457 |
| 5,379,224 | A | | 1/1995 | Brown et al. ................ 364/449 |
| 5,379,320 | A | | 1/1995 | Fernandes et al. ............. 375/1 |
| 5,416,797 | A | | 5/1995 | Gilhousen et al. .......... 375/705 |
| 5,418,538 | A | * | 5/1995 | Lau ............................ 342/357 |
| 5,420,592 | A | * | 5/1995 | Johnson ...................... 342/357 |
| 5,430,759 | A | | 7/1995 | Yokev et al. ................ 375/202 |
| 5,483,549 | A | | 1/1996 | Weinberg et al. ........... 375/200 |
| 5,519,403 | A | * | 5/1996 | Bickley et al. ............. 342/352 |
| 5,543,789 | A | * | 8/1996 | Behr et al. .................. 340/995 |
| 5,550,551 | A | * | 8/1996 | Alesio ........................ 342/457 |
| 5,579,013 | A | * | 11/1996 | Hershey et al. ........ 342/357.06 |
| 5,636,122 | A | * | 6/1997 | Shah et al. .................. 701/207 |
| 5,652,570 | A | * | 7/1997 | Lepkofker .................. 340/573 |
| 5,663,734 | A | | 9/1997 | Krasner ....................... 342/357 |
| 5,757,916 | A | * | 5/1998 | MacDoran et al. ........... 380/25 |
| 5,913,170 | A | * | 6/1999 | Wortham .................... 455/457 |
| 6,373,430 | B1 | * | 4/2002 | Beason et al. ......... 342/357.09 |

OTHER PUBLICATIONS

"An Application of the Global Positioning System to Search and Rescue and Remote Tracking", Raab, et al. Navigation "Journal of Institute of Navigation, vol. 24, No. 3, 1977".

"Loran–C Vehicle Tracking in Detroit's Public Safety Dispatch System", Laurence J. Cortland, vol. 36, No. 3 Journal of Institute of Navigation, Fall 1989.

"RTCM Recommended Standards for Differential Navstar GPS Service, Version 2.0" Radio Technical Commission for Maritime Services, Jan. 1, 1990.

"Animal–borne GPS: Tracking the Habitat", Rogers & Anson, GPS World, pp. 21, 22, Jul. 1994.

"Navstar GPS User Equipment, Introduction", NATO, Feb. 1991.

Amateur Radio Catalog; Summer 1996; pp. 52–55.

* cited by examiner

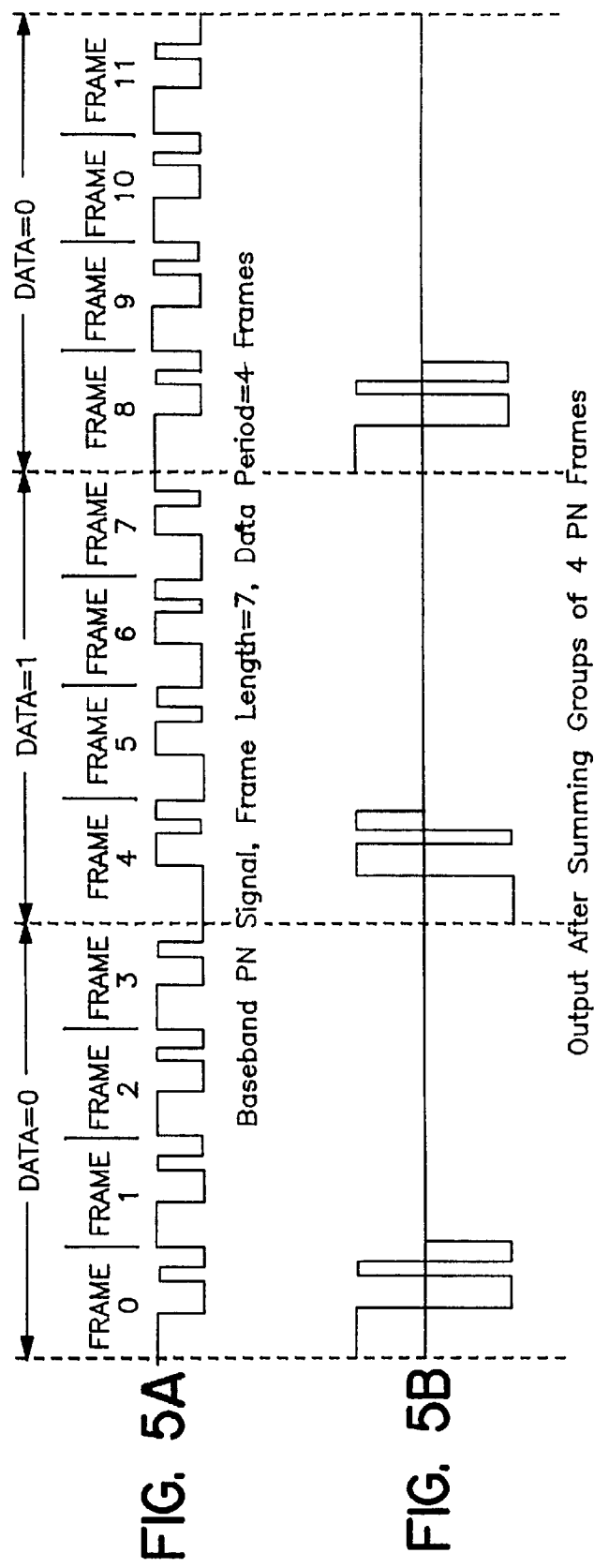

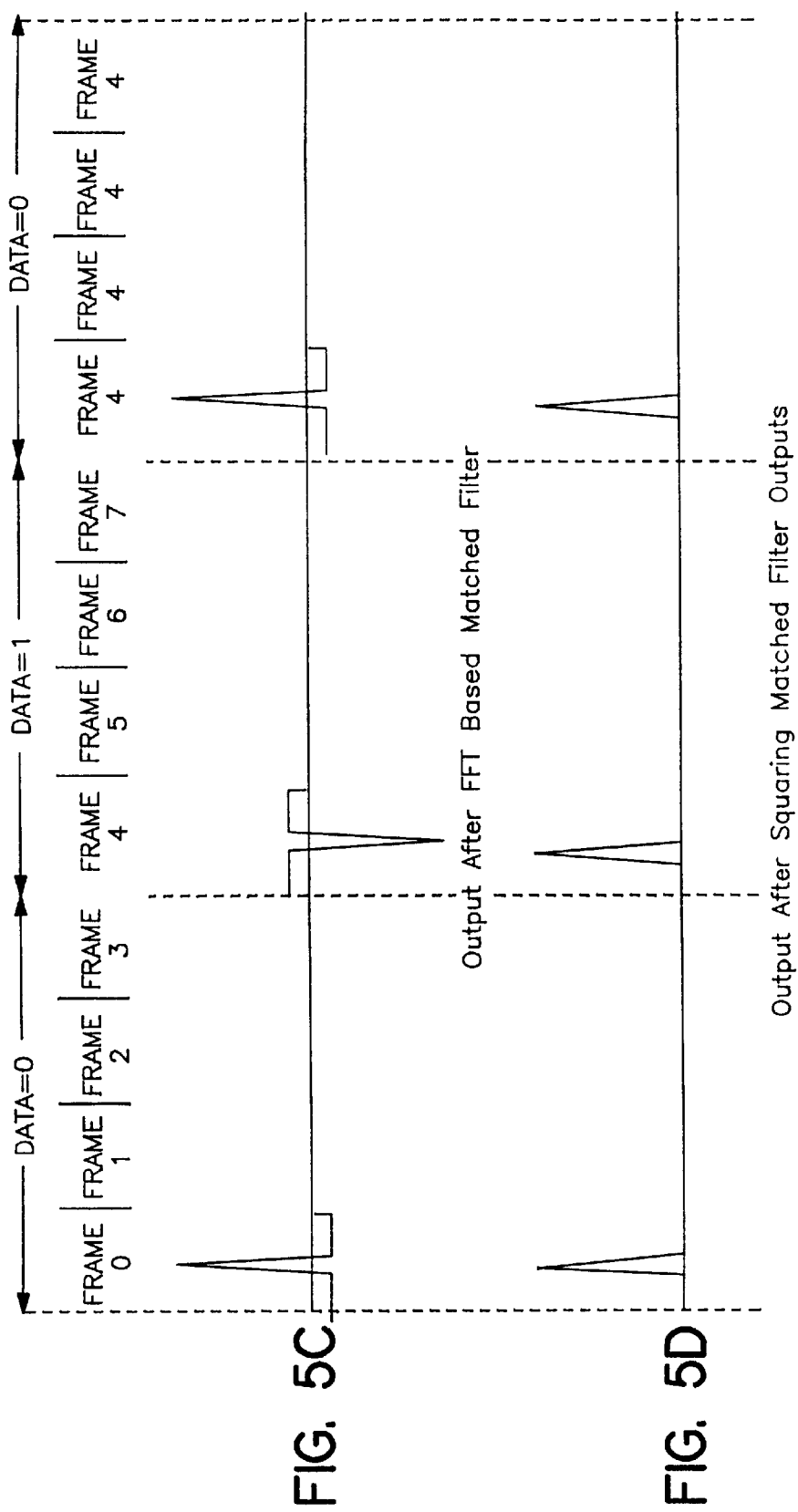

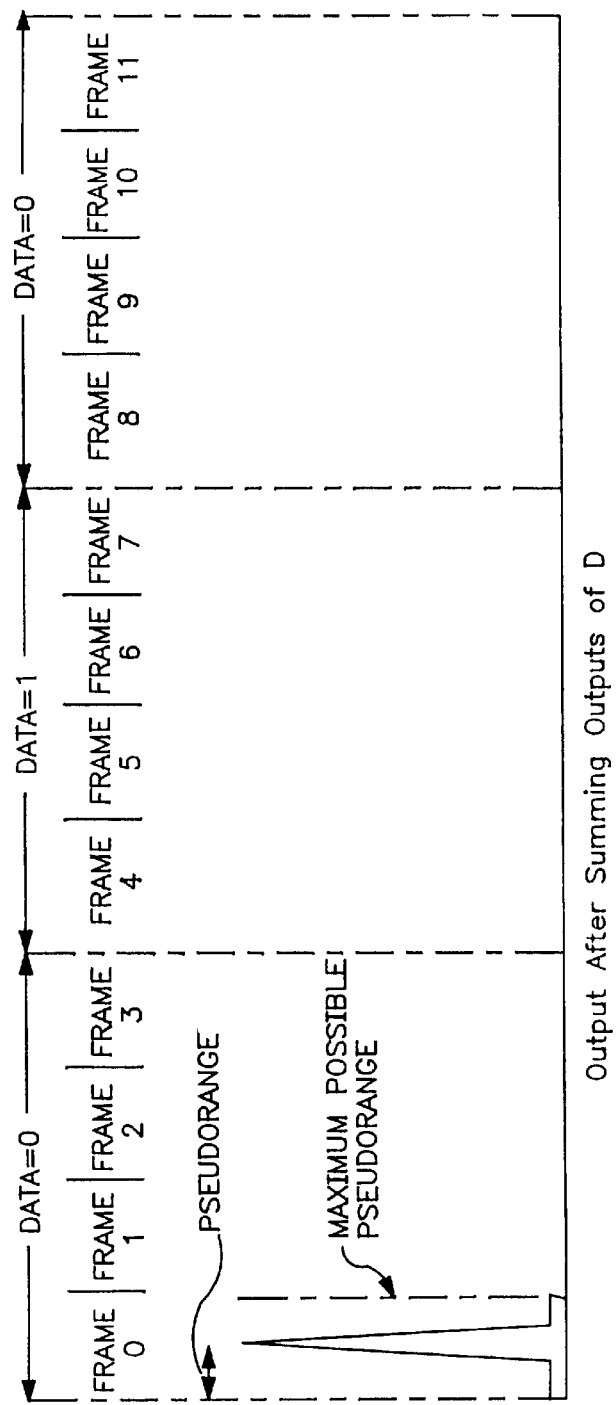

CLIENT-SERVER BASED REMOTE LOCATOR DEVICE

RELATED APPLICATIONS

This application is a divisional application of U.S. patent application Ser. No. 08/708,176, filed Sep. 6, 1996, now U.S. Pat. No. 6,131,067.

This application is related to and hereby claims the benefit of the filing date of a provisional patent application by one of the co-inventors, Norman F. Krasner, which application is entitled Low Power, Sensitive Pseudorange Measurement Apparatus and Method for Global Positioning Satellites Systems, Ser. No. 60/005,318, filed Oct. 9, 1995.

FIELD OF THE INVENTION

The present invention concerns client-server computer networks and the use of such networks to access remote sensors having associated position determination sensors.

BACKGROUND

Networking technology has developed a large network of networks, referred to as the Internet, which interconnects millions of computers around the world. The Internet allows the transfer of data between any number of computer systems connected to the Internet using the Transmission Control Protocol/Internet Protocol (TCP/IP). Computers responding to service requests from other computers, via the Internet, are commonly referred to as servers, and computers that initiate requests for service from a server are referred to as clients.

The Internet has become very popular in part due to the World Wide Web (WWW), which is a network of links to hypertext documents operating within the Internet. These hypertext documents are referred to as either Web documents, Web pages, or hypertext documents. Web documents are embedded with directly accessible connections or links to other documents which create a non-linear way of reading the document. The links are embedded in Web documents as a phrase of text or an image which can be selected and activated by a computer user. Information about the Web documents are controlled and provided by Web servers. At the user's end, a Web client takes the user's requests and passes them on to the Web server. A collection of related Web documents maintained by a single company or other entity is often referred to as a Web site.

The Web documents are written with a high level programming language referred to as the Hypertext Markup Language (HTML). Commands of the HTML, popularly known as tags, provide a variety of functions including, but not limited to, defining special format and layout information in a Web document, embedding images and sound in a Web document, and embedding links to other Web documents.

In order to access, process, and display a Web document, a client uses a set of instructions, referred to as a browser. The browser typically includes a set of browser commands corresponding to the tags available in the HTML. Each browser command in turn points to a procedure of one or more instructions defining the command which, when executed, provide a functionality of the respective command. If the client requires service from the Web server, the browser uses the Hypertext Transfer Protocol (HTTP) to communicate with the server.

The browser compares each tag found embedded in a Web document with the set of browser commands. Once a match is found, the browser executes the procedure corresponding to the matched browser command in order to provide the functionality of the respective command.

Recently, some Web sites have begun offering users navigation-like aids. For example, some Web sites allow users to request the location of a tourist attraction or other location (e.g., a restaurant) and provide a map or a series of directions to the location in question. Often the Web site provider will charge a user fee for this service or instead may charge a fee to restaurant owners and others who wish to have the location of their business, etc. accessible in this manner. In this fashion, the Internet and the World Wide Web are becoming a useful tool for locating fixed sites. What is lacking, however, is a way for a user to locate a mobile remote object using such technology.

SUMMARY

One embodiment of the present invention provides a computer implemented method of determining the location of a remote sensor. In operation, a user accesses a server using a client. The client provides an identification code which serves to uniquely identify a remote sensor. The remote sensor is capable of providing information related to its position. The server then interrogates the remote sensor which is identified based on the identification code. In response, the remote sensor transmits positioning data to the server where it is analyzed to derive the location of the remote sensor. The location so determined is transmitted from the server to the client and is displayed at the client so that the user can identify the location of the remote sensor.

In this embodiment, the client and the server may be connected to a computer network and the client may use a web browser to interrogate the server. In general, the web browser provides a graphical user interface for the user. The computer network may be the Internet, a local area network or another data communications network. Where the Internet is used, the server may provide a web page having means for the user to identify the remote sensor.

In another embodiment, the present invention provides a method of determining the location of a remote sensor wherein a position signal having positioning data and an identification code is transmitted from a remote sensor to a server. The server receives the position signal and analyzes the signal to generate information representing the location of the remote sensor. The server transmits this location information to a client where the location information is displayed, thereby allowing a user to identify the location of the remote sensor.

In this embodiment, the position signal transmitted by the remote sensor may include an emergency code. The signal may be transmitted using a modulated radio frequency carrier or other transmission media.

The remote sensor may be a SNAPSHOT GPS receiver capable of obtaining a position fix in a relatively short period of time. Other GPS receivers or positioning devices could also be used.

The user display may be a simple position report, e.g., latitude and longitude, or a graphical report which provides an indication of the remote sensor's location superimposed on a map or other reference.

BRIEF DESCRIPTION OF THE DRAWINGS

The present invention is illustrated by way of example and not limitation in the figures of the accompanying drawings in which like references indicate similar elements and in which:

FIGS. 5A, 5B, 5C, 5D and 5E illustrate a signal processing waveform at various stages of processing in a snapshot GPS receiver for use according to the present invention.

DETAILED DESCRIPTION

This invention concerns apparatus and methods for determining the position of a mobile, or remote, object using computer networks operating as clients and servers. One implementation of such a computer network is shown in FIG. 1A.

Figure 1A:
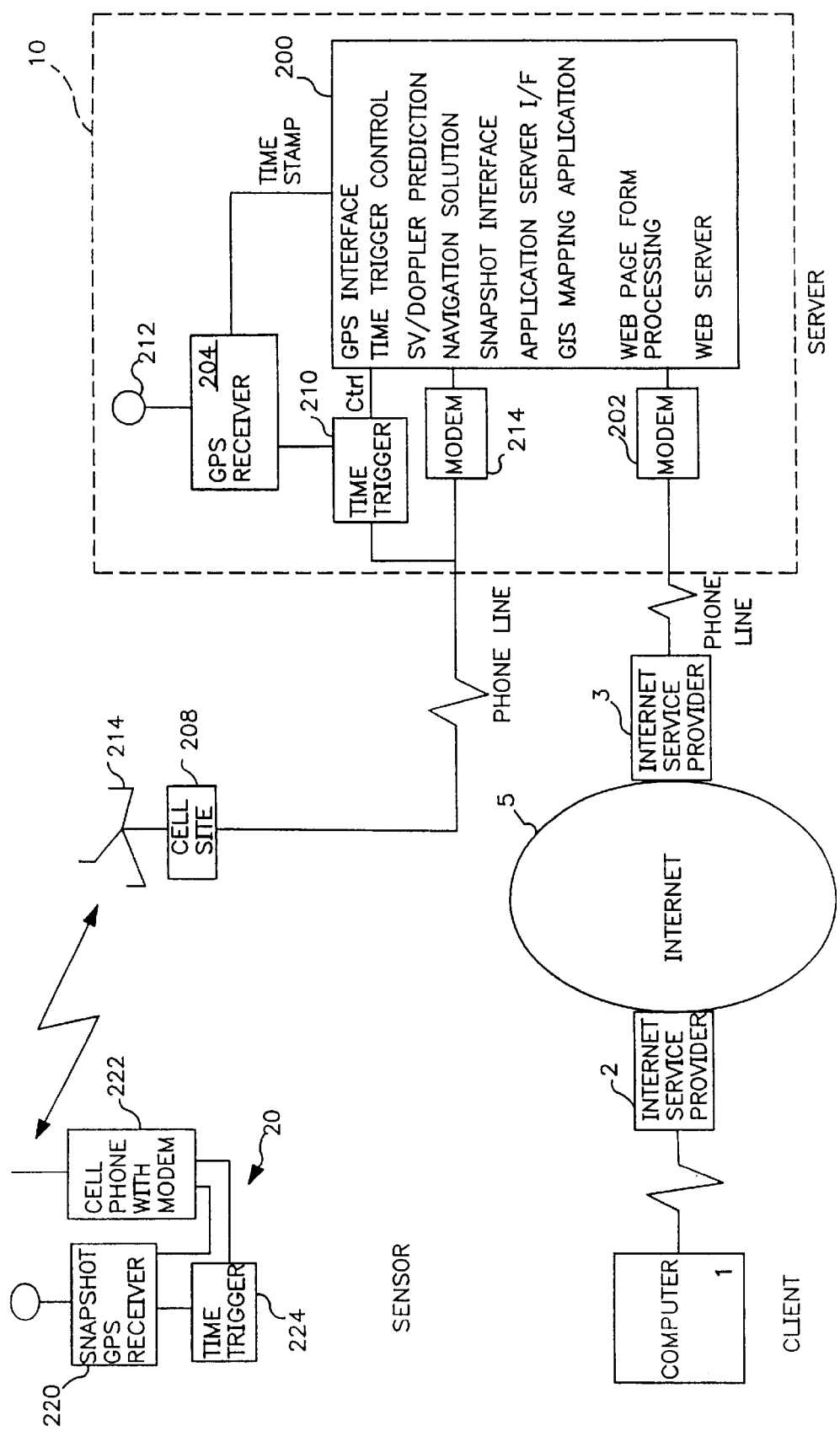
FIG. 1A is a block diagram of the major components of a computer implemented system for determining the location of a remote sensor utilizing the methods of the present invention.

FIG. 1A illustrates a user having a laptop or other computer 1 connected to a computer network such as the Internet 5. The Internet 5 is a large network of networks which interconnects millions of computers around the world. The user's computer 1 is connected to the Internet 5 via an Internet Service Provider 2. The Internet Service Provider 2 is generally a server which allows a number of remote users to connect to the Internet 5 over telephone or other communication (e.g., ISDN) links. Users establish accounts with the Internet Service Provider 2 to allow access to the Internet 5 on demand, typically through a dial-up connection. Computer 1 will be recognized as a Web client or browser.

Also connected to Internet 5 through an Internet Service Provider 3 is base station 10 which includes server 200. Server 200 is connected to the Internet 5 via telephone lines and modem 202. In alternative embodiments, server 200 may utilize ISDN or other data communications links to connect to Internet 5. Also, server 200 may be directly connected to Internet 5, without the need for Internet Service Provider 3.

Server 200 will be recognized as a Web Server. As such, it provides hypertext or Web documents which can be accessed by computer 1. These Web documents may be accessed directly through an Internet address associated with server 200 or by following links embedded in other Web documents as a phrase of text or an image which can be selected and activated by a computer user.

At the user's end, computer 1 includes a browser in order to access, process, and display Web documents. If the user requires service from server 200, the browser uses the Hypertext Transfer Protocol (HTTP) or other suitable protocol to communicate with the server 200 over Internet 5 as described above.

In addition to server 200, base station 10 includes a GPS receiver 204 with an associated GPS antenna 212. GPS receiver 204 is a conventional GPS receiver capable of determining exact GPS time from in-view satellites. GPS receiver 204 provides current GPS time to server 200 and also provides a one pulse per second signal to Time Trigger 210 as described below.

In one embodiment, the location of GPS antenna 212 may be precisely determined using a survey or other means. Then, position information produced by GPS receiver 204 can be compared against the known location of GPS antenna 212 to produce position correction information at base station 10. These position corrections can be applied to pseudoranges as Differential GPS (DGPS) corrections in order to precisely determine the location of GPS antenna 212 as is known in the art. As will be apparent upon review of this specification, however, the location of server 200 is not critical.

Base station 10 also includes a connection (e.g., modem 214) to a cellular telephone transmitter site (cell site) 208. Modem 214 is connected to server 200 to allow a telephone line connection to the cell site 208. In other embodiments, an ISDN or other data communications link may be used. Time Trigger 210 is also connected to the communications link to cell site 208 and is under the control of server 200. Time Trigger 210 provides a means of indicating time to a remote sensor 20 as described below. Cell site 208 has an associated antenna 214 which allows two-way communication with remote sensor 20.

Remote sensor 20 includes a conventional cellular telephone 222 which is connected to a SNAPSHOT GPS receiver 220 and a time trigger 224. The SNAPSHOT GPS receiver 220 is described in detail below. Briefly, SNAPSHOT GPS receiver 220 responds to commands from server 200, which are transmitted across the cellular communication link provided by cell site 208 and cell phone 222, to take a position fix using in-view GPS satellites. As described more fully below, the command from server 200 may also include Doppler prediction data regarding each of the in-view satellites. The Doppler information is collected by server 200 using GPS receiver 204. This Doppler information allows SNAPSHOT GPS receiver 220 to obtain rapid position fixes as it eliminates the Doppler uncertainty those skilled in the art will appreciate is inherent in all GPS position calculations. Cellular telephone 222 may include a modem or other communication device appropriate for the method of data transmission used. Time trigger 224 provides means of identifying an accurate time stamp for a snapshot of data taken by SNAPSHOT GPS receiver 220.

The command from server 200 may include a time trigger signal which provides the remote sensor 20 with an indication of the time. For example, server 200 may transmit a message which indicates that "at the tone, the time will be 'x'". This message is then followed by a tone generated by time trigger 210 in response to a control signal from server 200. Of course, other time trigger signals may also be used. Notice that time trigger 210 is connected to GPS receiver 204. Those skilled in the art will appreciate that GPS receivers such as GPS receiver 204 are capable of providing a very accurate timing reference output, for example, one pulse per second or fraction thereof. If such a timing reference signal is applied to time trigger 210, say once per second, then time trigger 210 will generate a time trigger output signal once per second on a stable basis when enabled by server 200 through a control signal. When time trigger 210 then receives a control signal from server 200 indicating that the time trigger signal is to be transmitted to remote sensor 20, the next time trigger signal generated (i.e., at the next one second interval as clocked by the output of GPS receiver 204) will be transmitted via cell site 208 to remote sensor 20.

Remote sensor 20 is able to use the received time trigger signal as the basis for initiating the collection of satellite data as described in detail below. Remote sensor 20 can then compute pseudoranges from the collected satellite data using SNAPSHOT GPS receiver 220 as described in detail below.

When SNAPSHOT GPS receiver 220 has obtained pseudoranges to the in-view satellites, this information is transmitted to base station 10 across the cellular communications link. Accompanying this information may be a message which indicates how long since the receipt of the time trigger signal it has been. This "delta time" can be computed by remote sensor 20 using an onboard clock. Knowing the time difference between the original command to initiate a position fix and the time taken to collect and process the satellite data, server 200 can compute the location of remote sensor 20 in a customary fashion. The pseudorange information from remote sensor 20 may be processed along with DGPS correction information at server 200 in order to obtain the precise location of remote sensor 20. Note that the DGPS correction information must be that for the general area in which remote sensor 20 is located. DGPS corrections are available for various areas from various services, for example Differential Corrections, Inc., which provides such information for various areas of the United States. Such DGPS corrections could be used at server 200 to refine the position calculation for remote sensor 20. The computed location of remote sensor 20 may then be transmitted via Internet 5 back to computer 1 where it is displayed for the user.

In summary, a user accesses server 200 using a computer 1. As part of this access, the user may provide an identification code which serves to uniquely identify remote server 20. Server 200 than interrogates the remote sensor 20 which is identified based on the identification code. In response, the remote sensor 20 transmits positioning data to the server 200 where it is analyzed to derive the location of the remote sensor 20. The positioning data may be raw GPS data or, preferably, pseudoranges. The location of remote sensor 20 so determined is transmitted from server 200 to computer 1 and is displayed so that the user can identify the location of the remote sensor 20.

In this embodiment, the client computer 1 and the server 200 have been described as being connected to the Internet 5. However, computer 1 and server 200 may be connected to any computer network. Client computer 1 may use a web browser to interrogate server 200 as described above, other may use another method of computer communications. For example, upon receiving the connection from computer 1, server 200 may download an applet across Internet 5 to computer 1 which, when executed by computer 1, allows computer 1 to communicate with server 200. Such an applet will, in general, provide a graphical user interface for the user to interface with server 200.

Regardless of the implementation, the user will be provided with information regarding the use of the location service provided through server 200. For example, the user may be required to provide a user name and password so that the user's preestablished account may be charged for the use of the service. Alternatively, the service may be provided as part of a user's cellular telephone or pager account. The user will also be provided with means to identify the remote sensor 20 of interest. Remote sensors may be identified by an identification code, such as the remote sensor's cellular telephone number or other unique identifying number. These identification numbers may be provided at the time a user subscribes to the location service.

The user display may be a simple position report, e.g., latitude and longitude, or a graphical report which provides an indication of the remote sensor's location superimposed on a map or other reference. In the latter situation, server 200 may have a geographical information system (GIS) application running which interfaces with the position information derived for remove sensor 20. The position information so determined may be used to index the GIS data structure so that appropriate GIS information may be downloaded to the client computer 1. For example, an appropriate section of a city map may be downloaded, with the location of the remote sensor highlighted on the map so that the user can easily identify the location of the remote sensor. It will be appreciated that such a location report provided by server 200 may be continuously updated by interrogating remote sensor 20 at various times and providing new position reports determined from these repeated interrogations to the client computer 1. This may be accomplished in various ways, for example a user may successively "reload" the corresponding web page for an updated position report, or the web page may support a JAVA applet which continuously updates as long as the user remains connected to the web page. In this way the user may be provided with continuous updates regarding the location of remote sensor 20. This information may be stored at computer 1 so as to provide a tracking plot of remote sensor 20.

Figure 1B:
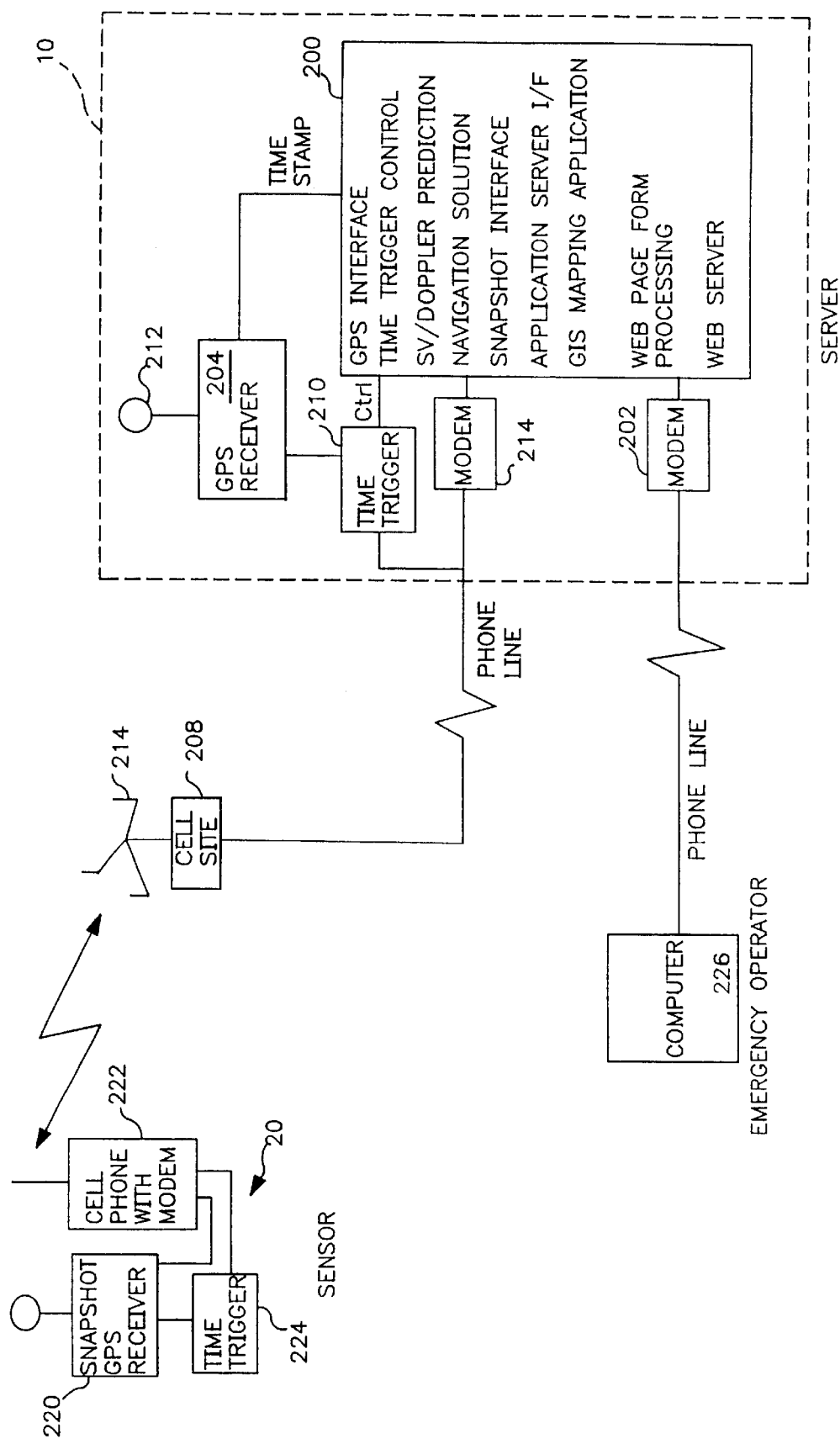
FIG. 1B is a block diagram of an alternate embodiment of a computer implemented system for determining the location of a remote sensor utilizing the methods of the present invention.

In another embodiment, illustrated in FIG. 1B, the present invention provides a method of determining the location of a remote sensor wherein a position signal having positioning data (e.g., raw GPD data or pseudoranges) and an identification code is transmitted from a remote sensor 20 to a server 200. The server 200 receives the position signal and analyzes the signal to generate information representing the location of the remote sensor. The server transmits this location information to a client computer 220 where the location of remote sensor 20 is displayed, thereby allowing a user to identify the location of the remote sensor 20.

In this embodiment, the position signal transmitted by the remote sensor may also include an emergency code. For example, in the event of an emergency, such as a medical emergency or otherwise, a user may press a "panic button" found on the front panel of cell phone 222 or SNAPSHOT GPS receiver 220 (where these are separate units). Pressing the panic button may cause cell phone 222 to transmit an emergency signal to cell site 208 where the emergency signal is relayed to server 200. In response, server 200 will transmit Doppler information regarding in-view satellites, a fix command and a time trigger signal to remote sensor 20 as described above, thereby allowing remote sensor 20 to compute pseudoranges to the in-view satellites. These pseudoranges are then relayed to server 200 as described above and used to compute the location of remote sensor 20.

When the location of remote sensor 20 has been determined, software running on server 200 configures server 200 such that a call or other signal is sent to a local emergency operator in the vicinity of remote sensor 20. This call or signal may be placed over a leased line, a standard telephone line, or via the Internet. When the call or signal is received at the emergency operator station, the location of remote sensor 20 is transmitted and displayed. In some cases, where separate panic buttons are available for identifying medical, police, fire or other types of emergencies, the nature of the emergency is also displayed for the emergency operator. Based on this information, the emergency operator can initiate an emergency response by providing the location of the remote sensor 20 to the required emergency service (police, fire department, ambulance service, etc.). In other embodiments, instead of or in addition to a position report for the remote sensor 20, the emergency operator may also be provided with information which identifies an emergency response vehicle in close proximity to remote sensor 20.

Other embodiments of the present invention may allow for stolen vehicle tracking, inventory control, parental supervision of minors, monitoring of probationers, or other situations, where accurate reporting of the location of a remote object are required. Although preferred embodiments of the present invention use SNAPSHOT GPS receivers, other positioning devices, such as conventional GPS receivers, could also be used.

Figure 2:
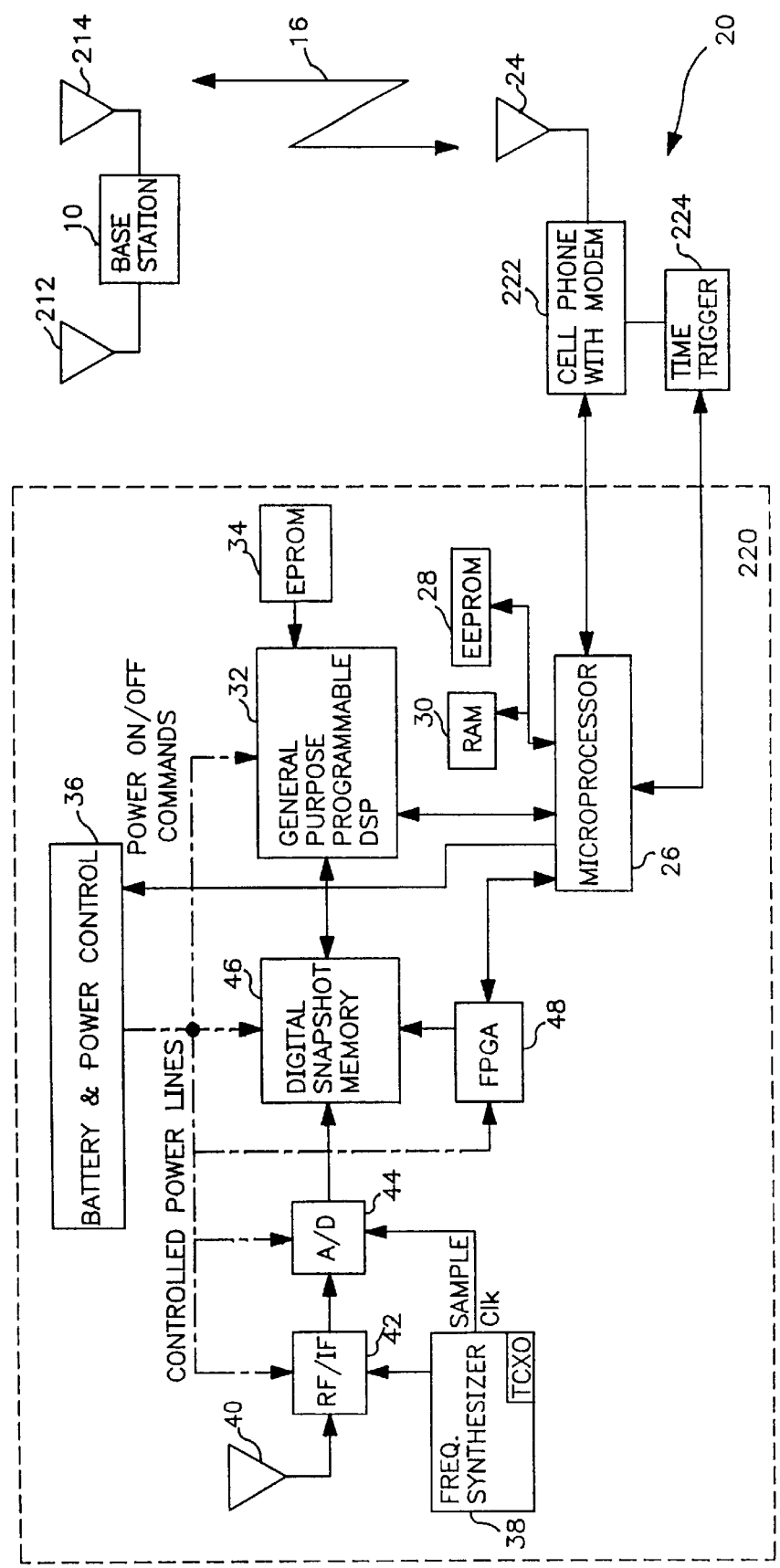
FIG. 2 is a block diagram illustrating one embodiment of a SNAPSHOT GPS receiver for use according to the present invention.

FIG. 2 illustrates one embodiment of the remote sensor 20 which includes a SNAPSHOT GPS receiver. As described above, remote sensor 20 uses information transmitted from separately located base station 10 to assist in determining the position of the remote sensor 20.

It should be noted that pseudoranges may be used to compute the remote's geographical position in many different ways. Three examples are:

Method 1: By retransmitting the satellite data messages to the remote sensor 20 from the base station 10, the remote sensor 20 may combine this information with the pseudorange measurements to compute its position. See, for example, U.S. Pat. No. 5,365,450, which is incorporated herein by reference.

Method 2: The remote sensor 20 may gather the satellite ephemeris data from the reception of GPS signals in the normal manner that is commonly practiced in the art. This data, which typically is valid for one to two hours, may be combined with pseudorange measurements, typically in the remote sensor, to complete the position calculation.

Method 3: The remote sensor 20 may transmit over a communications link 16 the pseudoranges to the base station 10 which can combine this information with the satellite ephemeris data to complete the position calculation. See, for example, U.S. Pat. No. 5,225,842, which is incorporated herein by reference. This is a presently preferred method of operation.

In Methods 1 and 3, it is assumed that the base station 10 has information regarding the in-view satellites for remote sensor 20. This may be the case where base station 10 and remote sensor 20 have a common view of all satellites of interest and are positioned close enough to one another to resolve a time ambiguity associated with the repetition rate of the GPS pseudorandom codes (approximately 150 km) or where base station 10 is provided with information regarding the approximate location of remote sensor 20 so that base station 10 can compute which satellites will be in-view for remote sensor 20. If this latter arrangement is used, base station 10 may also require DGPS correction information appropriate for the location of remote sensor 20.

For operation in accordance with Method 3 above, base station 10 may issue a command to perform a measurement via a message transmitted over data communications link 16. The base station 10 also sends within this message Doppler information for the satellites in-view. This Doppler information typically is in the format of frequency information. This message is received by cell phone 222, and it is stored in a memory 30 which is coupled to a low-power microprocessor 26. The microprocessor 26 handles data information transfer between the remote sensor processing elements 32–48 which make up SNAPSHOT GPS receiver 220 and the cell phone 222, and it controls power management functions within the remote receiver 20, as will be evident in the subsequent discussion. Normally, microprocessor 26 sets some or all of the SNAPSHOT GPS receiver 220 hardware to a low power, or power down, state, except when the pseudorange and/or other GPS calculations are being performed, or when an alternative source of power is available.

The above-mentioned Doppler information is a relatively small number of bytes because the required accuracy of such Doppler information is not high. For example, if 10 Hz accuracy were required and the maximum Doppler is approximately ±7 kHz, than an 11 bit word would suffice for each satellite in view. If 8 satellites were in view, then 88 bits would be required to specify all such Dopplers. The use of this information eliminates the requirement for the remote sensor 20 to search for such Doppler, thereby reducing its processing time by in excess of a factor of 10. Additional information may also be sent to the remote sensor 20, including the epochs of the data in the GPS message and the time trigger signal as discussed above.

The received data link signal may utilize a precision carrier frequency. The remote sensor 20 may employ an automatic frequency control (AFC) loop to lock to this carrier and thereby further calibrate its own reference oscillator. A message transmission line of 10 msec, with a received signal to noise ratio of 20 dB, will normally allow frequency measurement via an AFC to an accuracy of 10 Hz or better. This will typically be more than adequate for the requirements of the present invention.

For the embodiments described with reference to FIGS. 1A and 1B, the communication link 16 is a commercially available cellular telephone communications link. In other embodiments, narrow bandwidth communication links, such as two way pager links may be used. In this way, this system may be used in embodiments where the amount of data to be transmitted between the base station 10 and the remote sensor 20 is relatively small (e.g., where base station 10 sends a command to remote sensor 20 to perform a position fix). In other embodiments, where the amount of data to be transferred between base station 10 and remote sensor 20 is relatively large, a higher bandwidth communication link 16 will be required.

Once the remote sensor 20 receives a command from the base station 10 for GPS processing together with the Doppler information, the microprocessor 26 activates RF to IF converter 42. A/D Converter 44 and Digital Snapshot Memory 46 via a Battery and Power Control circuit 36. This causes signals from the in-view GPS satellites to be received via antenna 40 and downconverted via RF to IF converter 42 to an IF frequency. The IF frequency signal is transferred to A/D converter 44 where it subsequently undergoes digitization. A contiguous set of such data, typically corresponding to a duration of 100 milliseconds to 1 second (or even longer), is then stored in a Snapshot Memory 46. The addressing of this memory 46 is controlled by a Field Programmable Gate Array integrated circuit 48. Downconversion of the GPS signal is accomplished using a frequency synthesizer 38 as discussed further below.

Note that all this time (while the snapshot memory 46 is being filled with the digitized GPS signals from the in-view satellites) DSP 32 may be in a low power state. The A/D Converter 44 need only be turned on for a short period of time, sufficient to collect and store the data required for pseudorange calculation. After the data collection is complete, these converter circuits together with the RF/IF downconverters are turned off, thus not contributing to additional power dissipation during the actual pseudorange calculation. The pseudorange calculation is then performed using, in one embodiment, a general purpose, programmable digital signal processing IC 32 (DSP), as exemplified by a TMS320C30 integrated circuit from Texas Instruments. This DSP 32 is placed in an active power state by the microprocessor 26 via the Battery and Power Control circuit 36 prior to performing such calculations.

This DSP 32 differs from others used in some remote GPS units in that it is general purpose and programmable, as compared to specialized custom digital signal processing IC's. Furthermore, the DSP 32 makes possible the use of a Fast Fourier Transform (FFT) algorithm, which permits very rapid computation of the pseudoranges by performing rapidly a large number of correlation operations between a locally generated reference and the received signals. Typically, 2046 such correlations are required to complete the search for the epochs of each received GPS signal. The Fast Fourier Transform algorithm permits a simultaneous and parallel search of all such positions, thus speeding the required computation process by a factor of 10 to 100 over conventional approaches.

Once the DSP 32 completes its computation of pseudoranges for each of the in-view satellites, it transmits this information to microprocessor 26. At this time microprocessor 26 may cause DSP 32 to again enter a low power state by sending an appropriate control signal to the Battery and Power Control circuit 36. Then, microprocessor 26 utilizes cell phone 222 to transmit the pseudorange data over data link 16 to the base station 10 for final position computation. In addition to the pseudorange data, a time tag may be simultaneously transmitted to base station 10. The time tag indicates the elapsed time from the initial data collection in the buffer 46 to the time of transmission of the data over the data link 16. This time tag improves the capability of the base station 10 to complete the position calculation because it allows the computation of the GPS satellite positions at the time of data collection. As an alternative, DSP 32 may compute the position (e.g., the latitude, longitude and, if required, the altitude) of the remote sensor 20 and send this data to the microprocessor 26, which may similarly relay this data to the base station 10, via cell phone 222. This position computation may, alternatively be performed by microprocessor 26, under program control.

As shown in FIG. 2, cell phone 222, in one embodiment, utilizes a separate antenna 24 to transmit and receive messages over data link 16. Similarly, base station 10 may use a separate antenna 14 (such as the cell size antenna 214 described with references to FIGS. 1A and 1B) to transmit and receive data link messages, thus allowing continuous reception of GPS signals via GPS antenna 212 at the base station 10.

It is expected that the position calculations in the DSP 32 will require less than a few seconds of time, depending upon the amount of data stored in the digital snapshot memory 46 and the speed of DSP 32 or several DSPs.

It should be clear from the above discussion that the remote sensor 20 need only activate its high power consumption circuitry for a small fraction of time while in the snapshot mode, if position calculation commands are infrequent. The program commands necessary for the performance of the power management operation are stored in EEPROM 28 or other suitable storage media. This power management strategy may be adaptable to different power availability situations. For example, when prime power is available, the determination of position may occur on a continuing basis.

As indicated above, the digital snapshot memory 46 captures a record corresponding to a relatively long period of time. The efficient processing of this large block of data using fast convolution methods contributes to the ability of the present invention to process signals at low received levels (e.g., when reception is poor due to partial blockage from buildings, trees, etc.). All pseudoranges for visible GPS satellites are computed using this same buffered data. This provides improved performance relative to continuous tracking GPS receivers in situations (such as urban blockage conditions) in which the signal amplitude is rapidly changing.

Those skilled in the art will appreciate that the example shown in FIG. 2 is merely one possible implementation of a SNAPSHOT GPS receiver for use according to the present invention. Many other variations are possible in which various circuitry is shared between the snapshot GPS receiver and the cell phone 222. In other cases, no circuitry may be shared, for example, where a SNAPSHOT GPS receiver is coupled to a conventional cellular telephone 222 via an RS-232 or similar coupling. Other embodiments may have a minimum of shared circuitry, for example, a common antenna. Still other embodiments may have a common processor performing all position computations for the GPS unit, and other functions for the cellular telephone or other communications unit. Other embodiments are shown and described ink detail in co-pending U.S. patent application Ser. No 08/612,582, entitled "An Improved GPS Receiver Utilizing a Communications Link", filed Mar. 8, 1996 by Normal F. Krasner, now U.S. Pat. No. 5,874,914, issued Feb. 23, 1999, and assigned to the assignee of the present invention. Those skilled in the art will appreciate that all such alternatives are within the scope of the present invention and that the example shown in FIG. 2 is illustrative only. The remainder of this detailed description will assume that an embodiment such as that shown in FIG. 2 is used.

Figure 3A:
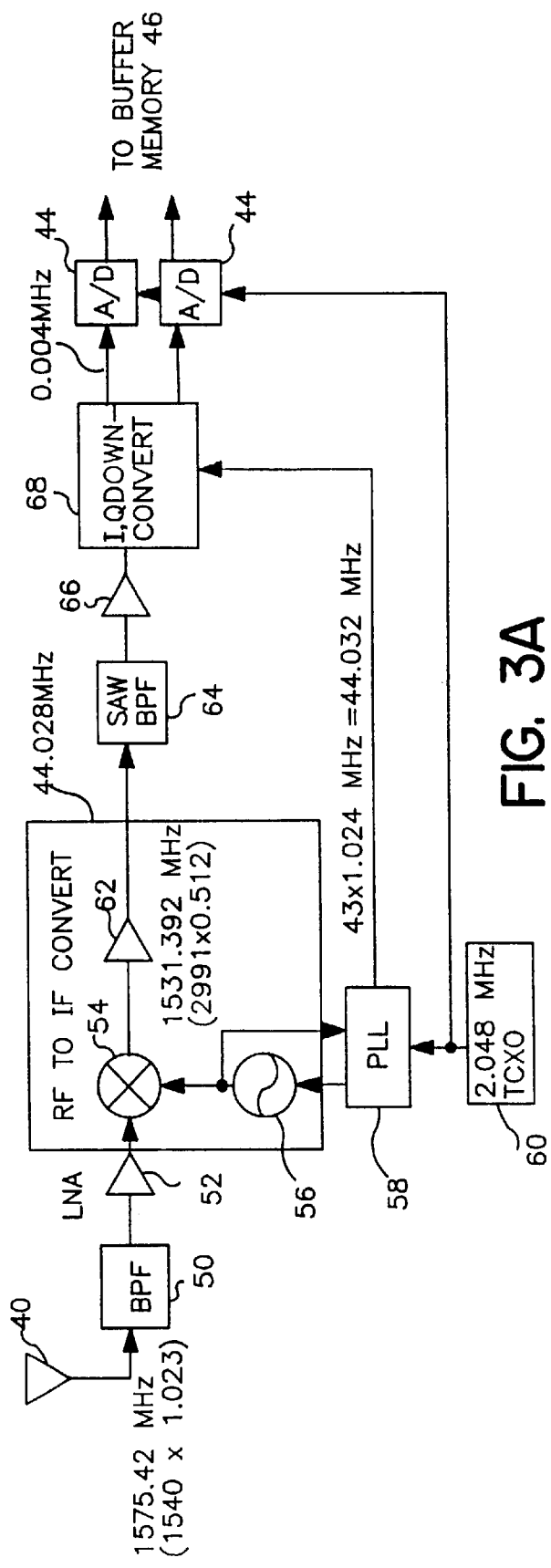
FIGS. 3A and 3B provide two alternatives for the RF and IF portions of a snapshot GPS receiver for use according to the present invention.

A representative example of an RF to IF frequency converter and digitizing system for SNAPSHOT GPS receiver 220 is shown in FIG. 3A. The input signal at 1575.42 MHz is passed through a handlimiting filter (BPF) 50 and low noise amplifier (LNA) 52 and sent to a frequency conversion stage. The local oscillator (LO) 56 used in this stage is phase locked (via PLL 58) to a 2.048 MHz (or harmonic thereof) temperature compensated crystal oscillator (TCXO) 60. In a preferred implementation, the LO frequency would be 1531.392 MHz, which is 2991×0.512 MHz. The resulting IF signal is then centered at 44.028 MHz. This IF is desirable due to the availability of low cost components near 44 MHz. In particular, surface acoustic wave (SAW) filters, which are utilized in abundance in television applications, are readily available. Of course, other handlimiting devices could be used instead of SAW devices.

The received GPS signal is mixed with the LO signal in mixer 54 to produce the IF signal. This IF signal is passed through a SAW filter 64, for precision bandlimiting to 2 MHz bandwidth, and then sent to an I/Q down-converter 68, which translates the signal to near baseband (4 kHz center frequency nominally). The local oscillator frequency for this downconverter 68 is derived from the 2.048 MHz TCXO 60 as the 43rd harmonic of 1.024 MHz, that is 44.032 MHz.

The I/Q downconverter 68 is generally commercially available as an RF component. It typically consists of two mixers and lowpass filters. In such instances, the input ports of one mixer are fed with the IF signal and the LO signal and the input ports to the other mixer are fed with the same IF signal and the LO signal phase shifted by 90°. The outputs of the two mixers are lowpass filtered to remove feedthrough and other distortion products.

As shown in FIG. 3A, amplifiers 62 and 66 may be used before and after the bandlimiting operation as required.

The two outputs of the I/Q downconverter 68 are sent to two matched A/D converters 44 which sample the signals at 2.048 MHz. An alternative implementation replaces the A/D converters 44 with comparators (not shown), each of which outputs a two-valued (one-bit) sequence of data in accordance with the polarity of the incoming signal. It is well known that this approach results in a loss of approximately 1.96 dB in receiver sensitivity relative to a multilevel A/D converter. However, there may be substantial cost savings in use of a comparator vs. A/D converters, as well as in the reduced memory requirement in the following snapshot memory 46.

Figure 3B:
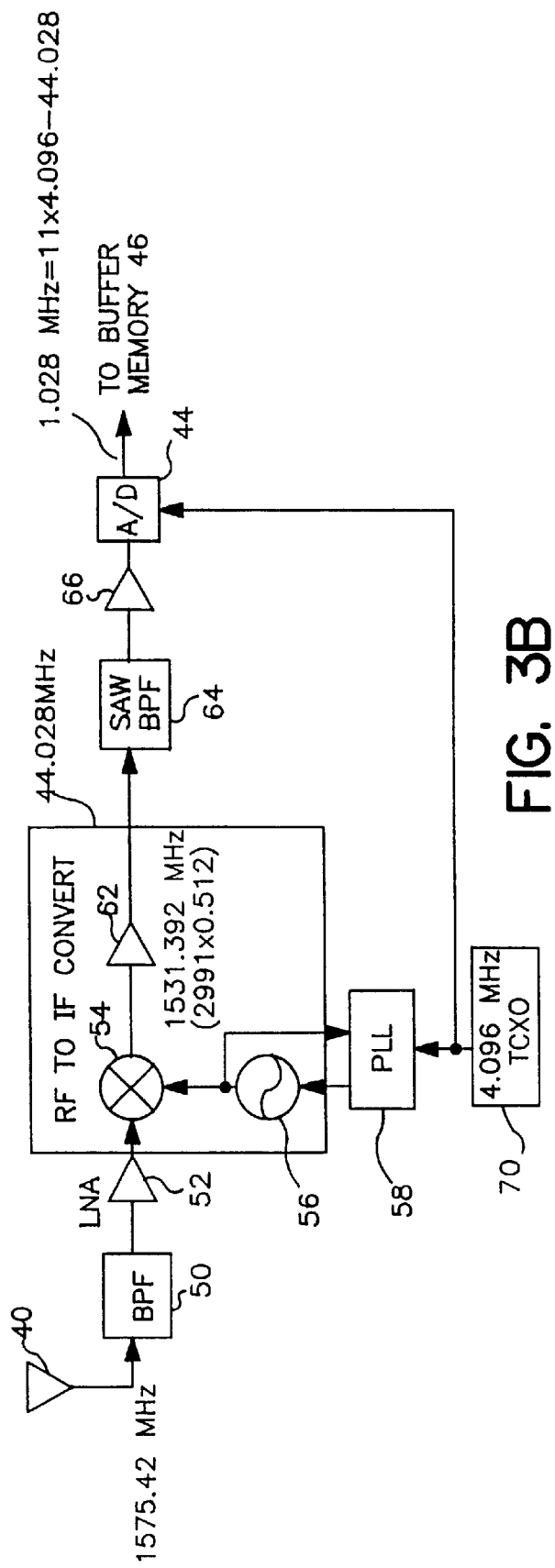

An alternative implementation of the downconverter and A/D system is shown in FIG. 3B which utilizes a bandpass sampling method. The TCXO 70 employed is at frequency 4.096 MHz (or an harmonic thereof). The TCXO output may be used as the sample clock to the A/D converter 44 (or comparator); this acts to translate the signal to 1.028 MHz. This frequency is the difference between the 11th harmonic of 4.096 MHz and the input IF frequency 44.028 MHz. The resulting 1.028 MHz IF is nearly one-fourth the sample rate, which is known to be nearly ideal in minimizing sampling type distortions. As compared to the I/Q sampling of FIG. 3A, this single sampler provides one channel of data rather than two, but at twice the rate. In addition, the data is effectively at an IF of 1.028 MHz. I/Q frequency conversion to near 0 MHz would then be implemented by digital means in the following processing to be described. The apparatus of FIGS. 3A and 3B are competitive in cost and complexity: often component availability dictates the preferred approach. It will be apparent to those skilled in the art, however, that other receiver configurations could be used to achieve similar results.

In order to simplify the following discussion, the following assumes that the I/Q sampling of FIG. 3A is employed and that the snapshot memory 46 contains two channels of digitized data at 2.048 MHz.

Figure 4:
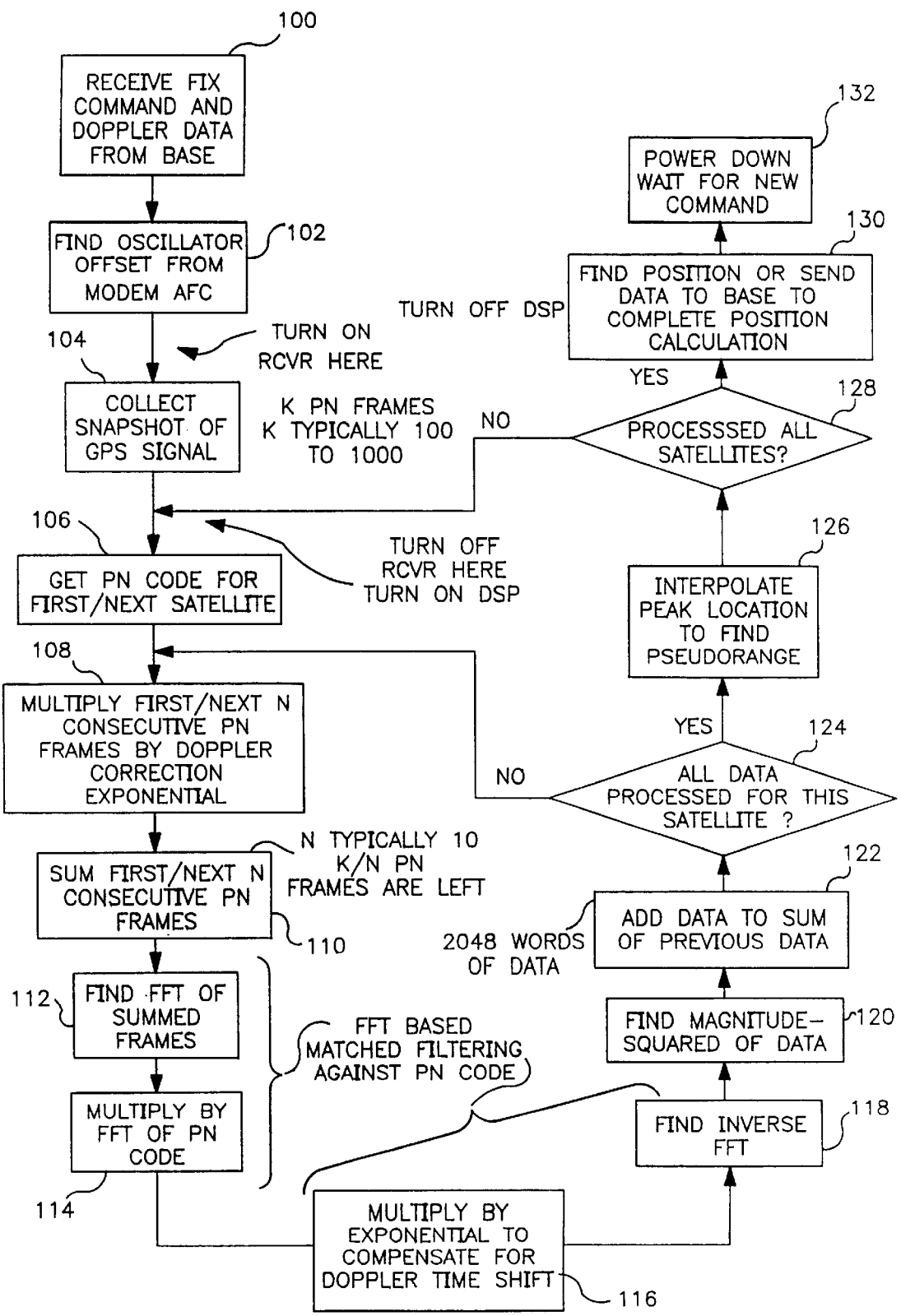
FIG. 4 shows a flowgraph of the major software operations performed by a programmable DSP processor of a snapshot GPS receiver for use according to the present invention.

Details of the signal processing performed in the DSP 32 may be understood with the aid of the flowgraph of FIG. 4 and the pictorial of FIGS. 5A–5E. It will be apparent to those skilled in the art that the machine code, or other suitable code, for performing the signal processing to be described is stored in EPROM 34. Other non-volatile storage devices could also be used. The objective of the processing is to determine the timing of the received waveform with respect to a locally generated waveform. Furthermore, in order to achieve high sensitivity, a very long portion of such a waveform, typically 100 milliseconds to 1 second, is processed.

In order to understand the processing, one first notes that each received GPS signal (C/A mode) is constructed from a high rate (1 MHz) repetitive pseudorandom (PN) pattern of 1023 symbols, commonly called "chips." These "chips" resemble the waveform shown in FIG. 5A. Further imposed on this pattern is low rate data, transmitted from the satellite at 50 baud. All of this data is received at a very low-signal-to-noise ratio as measured in a 2 MHz bandwidth. If the carrier frequency and all data rates were known to great precision, and no data were present, then the signal-to-noise ratio could be greatly improved, and the data greatly reduced, by adding to one another successive frames. For example, there are 1000 PN frames over a period of 1 second. The first such frame could be coherently added to the next frame, the result added to the third frame, etc. The result would be a signal having a duration of 1023 chips. The phasing of this sequence could then be compared to a local reference sequence to determine the relative timing between the two, thus establishing the so-called pseudorange.

The above process must be carried out separately for each satellite in view from the same set of stored received data in the snapshot memory 46, since, in general, the GPS signals from different satellites have different Doppler frequencies and the PN patterns differ from one another.

The above process is made difficult by the fact that the carrier frequency may be unknown by in excess of 5 kHz due to signal Doppler uncertainty and by an additional amount due to receiver local oscillator uncertainty. These Doppler uncertainties are removed in one embodiment of the present invention by storing such information in RAM 30 as described above. Alternatively, Doppler information could be transmitted from base station 10, which simultaneously monitors all GPS signals from in view satellites, in response to a signal via data link 16 indicating that remote sensor 20 had entered the snapshot mode. Thus, Doppler search is avoided at the remote sensor 20. The local oscillator uncertainty can also be greatly reduced (to perhaps 50 Hz) by the aforementioned AFC operation performed using the base to remote communication signal.

The presence of 50 baud data superimposed on the GPS signal still limits the coherent summation of PN frames beyond a period of 20 msec. That is, at most 20 frames may be coherently added before data sign inversions prevent further processing gain. Additional processing gain may be achieved through matched filtering and summation of the magnitudes (or squares of magnitudes) of the frames, as detailed in the following paragraphs.

The flowgraph of FIG. 4 begins at step 100 with a command to initialize a snapshot GPS processing operation (termed a "Fix Command" in FIG. 4). Where necessary, the command may include a transmission from remote sensor 20 to base station 10 for Doppler information for the in view satellites to be transmitted from base station 10 over data link 16. At step 102, the remote sensor 20 commutes its local oscillator drift, for example, by frequency locking to the signal transmitted from the base station 10. An alternative would be to utilize a very good quality temperature compensated crystal oscillator in the remote sensor. For example, digitally controlled TCXOs, so-called DCXOs, currently can achieve accuracy of about 0.1 parts per million, or an error of about 150 Hz for the L1 GPS signal.

At step 104 the remote sensor's microprocessor 26 turns on power to the receiver front end 42, Analog to Digital Converters 44 and digital snapshot memory 46; and collects a snapshot of data of duration K PN frames of the C/A code, where K is typically 100 to 1000 (corresponding to 100 msec to 1 second time duration). When a sufficient amount of data has been collected, microprocessor 26 turns off the RF to IF converter 42 and the A/D converters 44.

The pseudorange of each satellite is computed in turn as follows. First, at step 106 for the given GPS satellite signal to be processed, the corresponding pseudorandom code (PN) is retrieve from EPROM 34. As discussed shortly, the preferred PN storage format is actually the Fourier transform of this PN code, sampled at a rate of 2048 samples per the 1023 PN bits.

The data in snapshot memory 46 is processed in blocks of N consecutive PN frames, that is blocks of 2048N complex samples (N is an integer typically in the range 5 to 10). Similar operations are performed on each block as shown in the bottom loop (steps 108–124) of FIG. 4. That is, this loop is performed a total of K/N times for each GPS signal to be processed.

At step 108 the 2048N data words of the block are multiplied by a complex exponential that removes the effects of Doppler on the signal carrier, as well as the effects of drifting of the receiver local oscillator. To illustrate, suppose the Doppler frequency obtained from the base station 10 plus local oscillator offsets corresponded to $f_e$ Hz. Then the premultiplication of the data would take the form of the function $e^{-j2\pi f_e nT}$ n=[0, 1, 2, . . . , 2048N −1]+(B−1)×2048N, where T=1/2.048 MHz is the sampling period, and the block number B ranges from 1 to K/N.

Next, at step 110, the adjacent groups of N (typically 10) frames of data within the block are coherently added to one another. That is, samples 0, 2048, 4096, . . . 2048(N-1) −1) are added together, then 1, 2049, 4097, . . . 2048(N-1 are added together, etc. AT this point the block contains only 2048 complex samples. An example of the waveform produced by such a summing operation is illustrated in FIG. 5B for the case of 4 PN frames. This summing operation may be considered a preprocessing operation which precedes the fast convolution operations.

Next, at steps 112–118, each of the averaged frames undergoes a matched filtering operation, which purpose is to determine the relative timing between the received PN code contained within the block of data and a locally generated PN reference signal. Simultaneously, the effects of Doppler on the sampling times is also compensated for. These operations are greatly speeded, in one embodiment, by the use of fast convolution operations such as Fast Fourier Transform (FFT) algorithms used in a manner to perform circular convolution, as presently described.

In order to simplify discussion, the above mentioned Doppler compensation is initially neglected.

The basic operation to be performed is a comparison of the data in the block being processed (2048 complex samples) to a similar preference PN block stored locally. The comparison is actually done by (complex) multiplying each element of the data block by the corresponding element of the reference and summing the results. This comparison is termed a "correlation." However, an individual correlation is only done for one particular starting time of the data block, whereas there are 2048 possible positions that might provide a better match. The set of all correlation operations for all possible starting positions is termed a "matched filtering" operation. The full matched filtering operation is required in a preferred embodiment.

The other times of the PN block can be tested by circularly shifting the PN reference and reperforming the same operation. That is, if the PN code is denoted p(0) p(1) . . . p(2047), then a circular shift by one sample is p(1) p(2) . . . p(2047) p(0). This modified sequence tests to determine if the data block contains a PN signal beginning with sample p(1). Similarly the data block may begin with samples p(2), p(3), etc., and each may be tested by circularly shifting the reference PN and reperforming the tests. It should be apparent that a complete set of tests would require 2048×2048= 4,194,304 operations, each requiring a complex multiplication and addition.

A more efficient, mathematically equivalent method may be employed, utilizing the Fast Fourier Transform (FFT), which only requires approximately 12×2048 complex multiplications and twice the number of additions. In this method, the FFT is taken for the data block, at step 112, and for the PN block. The FFT of the data block is multiplied by the complex conjugate of the FFT of the reference, at step 114, and the results are inverse Fourier transformed at step 118. The resulting data so gotten is of length 2048 and contains the set of correlations of the data block and the PN block for all possible positions. Each forward or inverse FFT operation requires P/2 $\log_2$P operations, where P is the size of the data being transformed (assuming a radix-2 FFT algorithm is employed). For the case of interest, P=2048, so that each FFT requires 11×1024 complex multiplications. However, if the FFT of the PN sequence is prestored in EPROM 34, as in a preferred embodiment, then its FFT need not be computed during the filtering process. The total number of complex multiplies for the forward FFT, inverse FFT and the product of the FFTs is thus (2×11+2)×1024= 24576, which is a savings of a factor of 171 over direct correlation. FIG. 5C illustrates the waveform produced by this matched filtering operation.

The preferred method of the current invention utilizes a sample rate such that 2048 samples of data were taken over the PN period of 1023 chips. This allows the use of FFT algorithms of length 2048. It is known that FFT algorithms that are a power of 2, or 4, are normally much more efficient than those of other sizes (and 2048=$2^{11}$). Hence the sampling rate so chosen significantly improves the processing speed. It is preferable that the number of samples of the FFT equal the number of samples for one PN frame so that proper circular convolution may be achieved. That is, this condition allows the test of the data block against all circularly shifted versions of the PN code, as discussed above. A set of alternative methods, known in the art as "overlap save" or "overlap add" convolution may be utilized if the FFT size is chosen to span a number of samples different from that of one PN frame length. These approaches require approximately twice the number of computations as described above for the preferred implementation.

It should be apparent to one skilled in the art how the above process may be modified by utilizing a variety of FFT algorithms of varying sizes together with a variety of sample rates to provide fast convolution operations. In addition, a set of fast convolution algorithms exist when also have the property that the number of computations required are proportional to P $\log_2$P rather than $P^2$ as is required in straightforward correlation. Many of these algorithms are enumerated in standard references, for example, H. J. Nussbaumer, "Fast Fourier Transform and Convolution Algorithms," New York, Springer-Verlag, ©1982. Important examples of such algorithms are the Agarwal-Cooley algorithm, the split nesting algorithm, recursive polynomial nesting algorithm, and the Winograd-Fourier algorithm, the first three of which are used to perform convolution and the latter used to perform a Fourier transform. These algorithms may be employed in substitution of the preferred method presented above.

The method of time Doppler compensation employed at step 116 is now explained. In the preferred implementation, the sample rate utilized may not correspond exactly to 2048 samples per PN frame due to Doppler effects on the received GPS signal as well as local oscillator instabilities. For example, it is known that the Doppler shift can contribute a delay error of ±2700 nsec/sec. In order to compensate for this effect, the blocks of data processed in the above description need to be time shifted to compensate for this error. As an example, if the block size processed corresponds to 5 PN frames (5 msec), then the time shift from one block to another could be as much as ±13.5 nsec. Smaller time shifts result from local oscillator instability. These shifts may be compensated for by time shifting the successive blocks of data by multiples of the time shift required by a single block. That is, if the Doppler time shift block is d, then the blocks are time shifted by nd, n=0,1,2, . . . .

In general these time shifts are fractions of a sample. Performing these operations directly using digital signal processing methods involves the use of nonintegral signal interpolation methods and results in a high computation burden. An alternative approach, that is a preferred method of the present invention, is to incorporate the processing within the fast Fourier transform functions. It is well-known that a time shift of d seconds is equivalent to multiplying the Fourier Transform of a function by $e^{-j2\pi fd}$, where f is the frequency variable. Thus, the time shift may be accomplished by multiplying the FFT of the data block by $e^{-j2\pi nd/}$ $_T f$ for n=0, 1, 2, . . . , 1023 and by $e^{-j2\pi(n-2048)d/T} f$ for n=1024, 1025, . . . , 2047, where $T_I$ is the PN frame duration (1 millisecond). This compensation adds only about 8% to the processing time associated with the FFT processing. The compensation is broken into two halves in order to guarantee continuity of phase compensation across 0 Hz.

After the matched filtering operation is complete, the magnitudes, or magnitudes-squared, of the complex numbers of the block are computed at step 120. Either choice will work nearly as well. This operation removes effects of 50 Hz data phase reversals (as shown in FIG. 5D) and low frequency carrier errors that remain. The block of 2048 samples is then added to the sum of the previous blocks processed at step 122. Step 122 may be considered a post processing operation which follows the fast convolution operation provided by steps 122–188. This continues until all K/N blocks are processed, as shown by the decision block at step 124, at which time there remains one block of 2048 samples, from which a pseudorange is calculated. FIG. 5E illustrates the resulting waveform after the summing operation.

Pseudorange determination occurs at step 126. A peak is searched for above a locally computed noise level. If such a peak is found, its time of occurrence relative to the beginning of the block represents the pseudorange associated with the particular PN code and the associated GPS satellite.

An interpolation routine is utilized at step 126 to find the location of the peak to an accuracy much greater than that associated with the sample rate (2.048 MHz). The interpolation routine depends upon the prior bandpass filtering used in the RF/IF portion of the remote receiver 20. A good quality filter will result in a peak having a nearly triangular shape with the width of the base equal to 4 samples. Under this condition, following subtraction of an average amplitude (to remove a DC baseline), the largest two amplitudes may be used to determine the peak position more precisely. Suppose these amplitudes are denoted $A_p$ and $A_{p+1}$, where $A_p \geq A_{p+1}$, without loss of generality, and p is the index of the peak amplitude. Then the position of the peak relative to that corresponding to $A_p$ may be provided by the formula: peak location=$p+A_p/(A_p+A_{p+1})$. For example if $A_p=A_{p+1}$, then the peak location is found to be p+0.5, that is, halfway between the indices of the two samples. In some situations the bandpass filtering may round the peak and a three point polynomial interpolation may be more suitable.

In the preceding processing, a local noise reference used in thresholding may be computed by averaging all the data in the final averaged block, after removing the several largest such peaks.

Once the pseudorange is found, the processing continues at step 128 in a similar manner for the next satellite in view, unless all such satellites have been processed. Upon completion of the processing for all such satellites, the process continues at step 130 where the pseudorange data is transmitted to the base station 10 over communication (i.e., data) link 16, where the final position calculation of the remote is performed (assuming Method 3 is utilized). Alternatively, the position calculation may be performed at remote sensor 20 using satellite ephemeris data transmitted from base station 10 and stored in RAM 30. In such an embodiment, the computed position may be transmitted to base station 10 over data link 16. Finally, at step 132, the majority of the circuitry of the remote sensor 20 is placed in a low power state, awaiting a new command to perform another positioning operation.

In the foregoing embodiment, the processing of GPS signals from each satellite while in the snapshot mode occurs sequentially in time, rather than in parallel. In an alternative embodiment, the GPS signals from all in-view satellites may be processed together in a parallel fashion in time.

Figure 6:
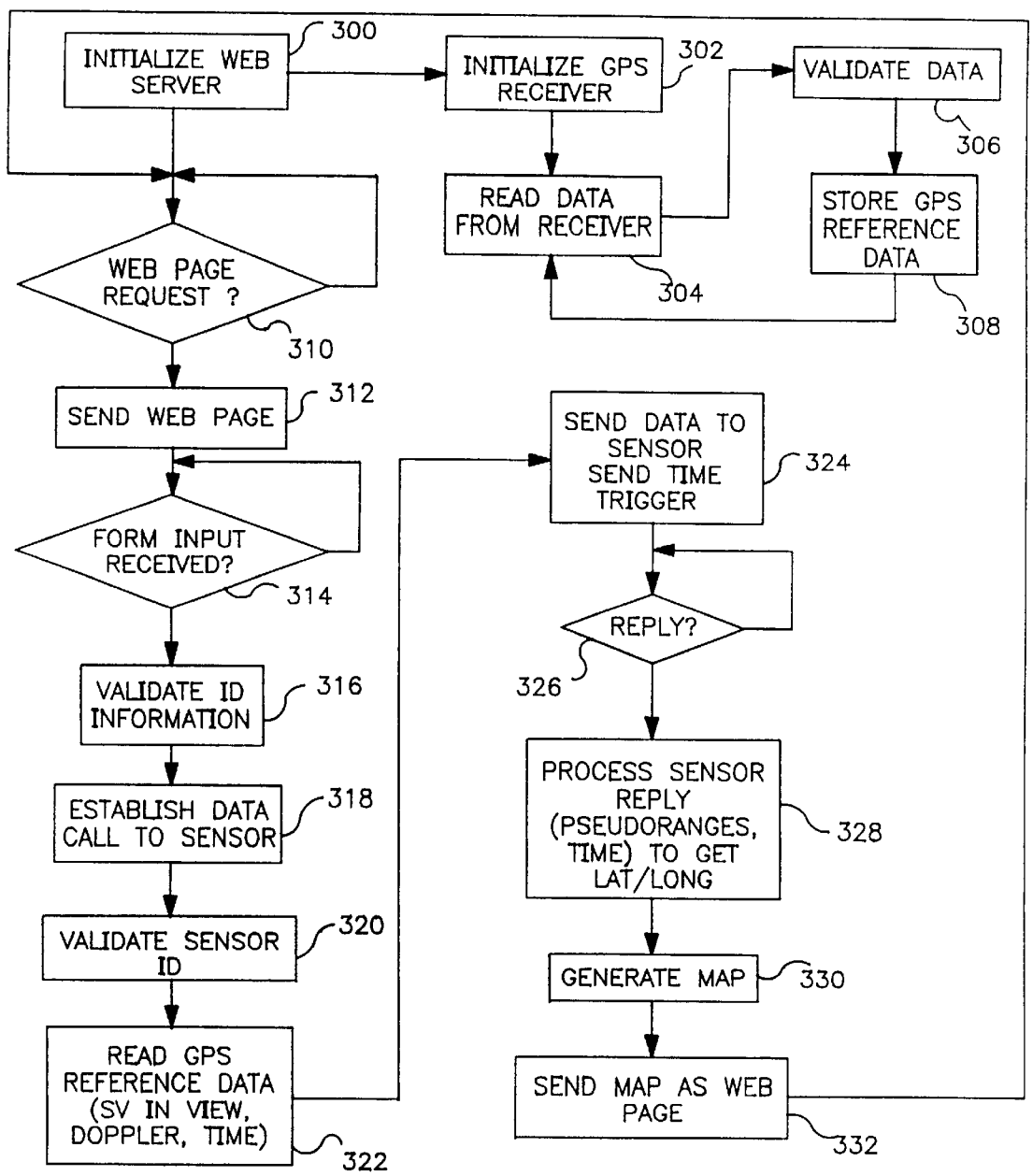
FIG. 6 is an exemplary flow diagram for the server functions according to one embodiment of the present invention.

Referring now to FIG. 6, an exemplary flow diagram illustrating the major processing operations performed by server 200 is shown. Beginning at step 300, server 200 is initialized. As part of this process, server 200 activates GPS receiver 204 (step 302) which begins to collect GPS data. As part of step 302, GPS receiver 204 may compute the location of server 200/base station 10 in order to produce DGPS corrections. When GPS data is available, server 200 reads the data at step 304. This data may be validated (e.g., by comparing computed positions to known positions of server 200) at step 306 and then stored at step 308. The GPS data may include Doppler information for available GPS satellites for later use by remote sensors 20. The process of reading, validating and storing GPS data is a continual one and may run in the background on server 200 during all of the steps described below.

Server 200 remains in a wait state at step 310 until a request for Web page is received. The request may come from a remote user via the Internet as described above. When such a request is received, server 200 transmits Web page information to the client a step 312.

As indicated above, the Web page may ask for user input. In such a case, server 200 waits at step 314 until such information is transmitted from the client. The information may be entered by a user filling out a form which is part of the Web page transmitted during step 312.

When user input is received, server 200 attempts to validate any user identification (ID) information at step 316. This may include accessing a user account data base maintained at server 200, or perhaps remotely at a cellular telephone service provider location, in order to ensure that an authorized request for information is being attempted. Assuming the user information is valid, server 200 initiates a data call to remote sensor 20 at step 318. This data call may require a separate sensor ID validation step 320 where a remote sensor 20 transmits a sensor ID and server 200 checks to ensure that the remote sensor 20 which responded to the data call is the remote sensor 20 which corresponds to the original user request.

When the server 200 has verified that it is in communication with the correct remote sensor 20, server 200 reads the previously stored GPS data at step 322 and then transmits the data (e.g., satellites in-view, Doppler, etc.) along with a time trigger at step 324 as discussed in detail above. Once this information has been sent to the remote sensor 20, server 200 waits at step 326 for a reply.

When the reply (e.g., pseudoranges) is received from remote sensor 20, server 200 uses the reply data to compute the location of remote sensor 20 at step 328 as discussed above. When the location of remote sensor 20 has been computed, this information may be used at step 330 to generate a map which graphically illustrates the location of remote sensor 20. The map may be part of a GIS data base maintained at server 200 as mentioned above. Once generated, the map, showing the location of remote sensor 20, may be transmitted from server 200 to the client as a Web page at step 332. Upon completion of this operation, sever 200 again waits for a Web page request at step 310.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PRN code (similar to a GPS signal) modulated on an L-band carrier signal, generally synchronized with GPS time. Each transmitter may be assigned a unique PRN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

It will be further appreciated that the methods and apparatus of the present invention are equally applicable for use with the GLONASS and other satellite-based positioning systems. The GLONASS system differs from the GPS system in that the emissions from different satellites are differentiated from one another by utilizing slightly different carrier frequencies, rather than utilizing different pseudorandom codes. In this situation, substantially all the circuitry and algorithms described above are applicable, with the exception that when processing a new satellite's emission, a different complex exponential multiplier is used to preprocess the data. The operation may be combined with the Doppler correction operation of step 108 of FIG. 4, without requiring any additional processing operations. Only one PN code is required in this situation, thus eliminating step 106.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A precise positioning apparatus, comprising:
    a central processing unit configured to process position information received from a mobile remote sensor;
    a communication unit coupled to said central processing unit, said communication unit configured to transmit a position acquisition assistance signal to said mobile remote sensor and to receive said position information from said mobile remote sensor, said communication unit further configured to provide said position information to said central processing unit; and
    a communication node coupled to said central processing unit, said communication node configured to communicate with a client station remote from said precise positioning apparatus and to provide a position report for said remote sensor to said client station.

2. A precise positioning apparatus as in claim 1 further comprising:
    a digital map stored in a storage device coupled to said central processing unit, said digital map comprising a data structure configured to be accessed by said central processing unit using location information, said location information representing a precise position of said remote sensor,
    wherein said position report comprises a reference to said digital map.

3. A precise positioning apparatus as in claim 2 wherein said digital map comprises a data structure capable of being indexed using said location information.

4. An apparatus as in claim 1 wherein said mobile remote sensor comprises a GPS receiver and wherein said position acquisition assistance signal comprises at least one of Doppler information for in view satellites, satellite ephemeris data, a time trigger, and satellites in view.

5. A precise positioning apparatus as in claim 4 wherein said GPS receiver is a snapshot GPS receiver.

6. A precise positioning apparatus as in claim 4 wherein said GPS receiver generates said positioning information in response to a request signal from said communication unit.

7. A precise positioning apparatus as in claim 1 wherein:
    said client station is configured to accept a user input and to display graphical and textual information;
    said remote sensor is configured to provide said positioning information in response to a request signal from said communication node after receiving said position acquisition assistance signal;
    said communication unit transmits said position acquisition assistance signal to said mobile remote sensor in response to said communication node receiving said user input communicated from said client station; and
    upon receipt of said position report, said client station displays information based upon a precise position of said mobile remote sensor.

8. A precise positioning apparatus as in claim 7 wherein said communication node is configured to communicate with a web browser of said client station through a computer network.

9. A precise positioning apparatus as in claim 1 wherein said communication unit is configured to provide a two-way link with said mobile remote sensor.

10. A precise positioning apparatus as in claim 9 wherein said communication unit modulates a radio frequency carrier signal to communicate with said mobile remote sensor through said two-way link.

11. A precise positioning apparatus as in claim 10 wherein said communication unit is configured to communicate with a cellular telephone of said mobile remote sensor.

12. A precise positioning apparatus as in claim 10 wherein said communication unit is configured to communicate with a two-way pager of said mobile remote sensor.

13. A precise positioning apparatus as in claim 10 wherein said communication unit is configured to communicate with a two-way radio of said mobile remote sensor.

14. A precise positioning apparatus as in claim 1 further comprising:
    a differential GPS station coupled to said central processing unit;
    wherein said position acquisition assistance signal comprises differential GPS signals from said differential GPS station.

15. A precise positioning apparatus as in claim 1 wherein said central processing unit analyzes said position information to produce said position report, said position report representing a precision position of said remote sensor.

16. A precise positioning apparatus as in claim 15 wherein said communication node transmits said position report over the Internet to said client station.

17. A precise positioning apparatus as in claim 16 wherein said position information comprises positioning data and an identification code.

18. A precise positioning apparatus as in claim 17 wherein said position information further comprises an emergency code.

19. A precise positioning apparatus as in claim 16 wherein position information is modulated on a radio frequency carrier signal transmitted from said remote sensor to said communication unit.

20. A precise positioning apparatus as in claim 19 wherein said communication unit demodulates said radio frequency carrier signal to extract said position information.

21. A precise positioning apparatus as in claim 20 wherein said central processing unit associates said positioning information with a digital map to produce said positioning report, said positioning report comprising a graphical representation of said precise position of said remote sensor.

22. A precise positioning apparatus as in claim 20 wherein said remote sensor comprises a GPS receiver, wherein said position information comprises pseudoranges, and wherein said central processing unit resolves said pseudoranges into location coordinates and associates said location coordinates with a digital map to generate said position report.

23. A precise positioning apparatus as in claim 22 wherein said central processor applies differential GPS corrections to said pseudoranges to derive said location coordinates.

24. A precise positioning apparatus as in claim 21 wherein said remote sensor comprises a GPS receiver; wherein said positioning information comprises a latitude and a longitude; and, wherein said central processing unit retrieves from a database a portion of said digital map to generate said position report, said portion representing an area in proximity to said remote sensor, said database comprising said digital map.

25. A precise positioning apparatus as in claim 21 wherein said remote sensor comprises a GPS receiver, wherein said positioning information comprises raw GPS data, and wherein said central processor:

applies differential GPS corrections to said raw GPS data to generate corrected GPS data;

determines said precise position of said remote sensor using said corrected GPS data; and retrieves from a database a portion of said digital map, said portion representing an area in proximity to said remote sensor, said database comprising said digital map.

26. A precise positioning apparatus as in claim 1 wherein said communication unit transmits a request for said position information to said mobile remote sensor after said communication node receives a request for a precise position location of said mobile remote sensor.

27. A precise positioning apparatus as in claim 1 wherein said position report comprises map data and computer programming instructions which, when executed by a digital processing system, cause said digital processing system to display a map showing said precise position location on said map.

28. A precise positioning apparatus as in claim 1 wherein said communication unit and said communication node share at least a portion of common hardware.

29. A precise positioning apparatus as in claim 1 wherein said communication unit establishes communication over a data link with said mobile remote sensor in response to a request for a location of said mobile remote sensor.

30. A precise positioning apparatus as in claim 29 wherein said communication node receives said request via the Internet.

31. A precise positioning apparatus as in claim 30 wherein said positioning information comprises one of:
a) pseudoranges; and
b) latitude and longitude.

* * * * *

UNITED STATES PATENT AND TRADEMARK OFFICE
CERTIFICATE OF CORRECTION

PATENT NO.     : 6,661,372 B1                                        Page 1 of 1
DATED          : December 9, 2003
INVENTOR(S)    : Richard J. Girerd and Norman F. Kranser It is certified that error appears in the above-identified patent and that said Letters Patent is hereby corrected as shown below:

<u>Title page,</u>
Item [74], *Attorney, Agent or Firm*, please delete "Greenhalls" and replace with
-- Greenhaus --, and remove "Beacon" and replace with -- Brown --

Signed and Sealed this

First Day of June, 2004

JON W. DUDAS
*Acting Director of the United States Patent and Trademark Office*